US008178788B2

(12) United States Patent
Yagisawa et al.

(10) Patent No.: US 8,178,788 B2
(45) Date of Patent: May 15, 2012

(54) ELECTRONIC COMPONENT PACKAGE

(75) Inventors: Takatoshi Yagisawa, Kawasaki (JP); Tadashi Ikeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 838 days.

(21) Appl. No.: 12/222,115

(22) Filed: Aug. 1, 2008

(65) Prior Publication Data
US 2008/0289862 A1  Nov. 27, 2008

Related U.S. Application Data

(63) Continuation of application No. PCT/JP2006/302356, filed on Feb. 10, 2006.

(51) Int. Cl.
H05K 1/02 (2006.01)
H05K 1/11 (2006.01)
(52) U.S. Cl. .......................... 174/259; 174/260
(58) Field of Classification Search .................. 174/254, 174/259, 260
See application file for complete search history.

(56) References Cited

U.S. PATENT DOCUMENTS

| 5,631,446 | A | 5/1997 | Quan |
| 6,861,633 | B2 * | 3/2005 | Osborn ...................... 250/208.1 |
| 7,145,411 | B1 * | 12/2006 | Blair et al. ....................... 333/5 |
| 2003/0024633 | A1 | 2/2003 | Ogura et al. |
| 2004/0159462 | A1 * | 8/2004 | Chung .......................... 174/259 |
| 2007/0149001 | A1 * | 6/2007 | Uka ............................... 439/67 |

FOREIGN PATENT DOCUMENTS

| JP | 9-139610 | 5/1997 |
| JP | 10-41420 | 2/1998 |
| JP | 2003-86728 | 3/2003 |
| JP | 2004-71950 | 3/2004 |
| JP | 2004-152963 | 5/2004 |
| JP | 2005-26801 | 1/2005 |

OTHER PUBLICATIONS

Japanese Office Action issued May 24, 2011 in corresponding Japanese Patent Application 2007-557721.

* cited by examiner

*Primary Examiner* — Jeremy Norris
(74) *Attorney, Agent, or Firm* — Staas & Halsey LLP

(57) ABSTRACT

An electronic component package includes a film board where an electronic component is mounted, and a lid part mounted on the film board so as to cover a surface of the film board. The electronic component is provided in a cavity formed by the film board and the lid part, and the electronic component is connected to a signal wiring conductor formed at the film board.

19 Claims, 13 Drawing Sheets

ELECTRONIC COMPONENT PACKAGE

CROSS-REFERENCE TO RELATED APPLICATION

This application is a U.S. continuation application filed under 35 USC 111(a) claiming benefit under 35 USC 120 and 365(c) of PCT application JP2006/302356, filed Feb. 10, 2006. The foregoing applications are hereby incorporated herein by reference.

BACKGROUND OF THE INVENTION

1. Field of the Invention

The present invention generally relates to electronic component packages. More specifically, the present invention relates to the structure of a package of an electronic component such as a compound semiconductor which is used to transmit signals with a high transmission rate and requires a sealed environment.

2. Description of the Related Art

Compound semiconductors ICs such as GaAs (gallium arsenide) or InP (indium phosphide) having high frequency properties are used for optical transceivers or the like. In order to prevent degradation with time due to corrosion of an IC or wiring, the compound semiconductor is packaged by metal, ceramic, or the like to ensure sealability. In addition, in the high frequency IC package, if the resin or the like comes in contact with the connection part or the surface of the IC, the high frequency properties may become degraded. Therefore, it is general practice to apply a cavity structure to the high frequency IC package.

FIG. 1 through FIG. 3 are schematic views showing first through third related art examples of a driver IC package having a compound semiconductor IC and an optical component.

In the first example shown in FIG. 1 in the related art, a driver IC package 1 having a compound semiconductor IC and an optical component 7 are connected to each other by a coaxial cable 503. Furthermore, in an example shown in FIG. 2 in the related art, a printed wiring board 6 having a main surface where a high frequency device 5 is mounted and an optical component 7 are connected to each other by a wire 8 made of gold (Au). In an example shown in FIG. 3, the printed wiring board 6 having the main surface where the high frequency device 5 is mounted and the optical component 7 are connected to each other by leads 9 made of metal.

On the other hand, in a module such as the optical transceiver where such as the driver IC package 1 or the high frequency device 5 is used, accelerating of transmitted signals, miniaturization of the module, and low manufacturing cost are required.

However, since the coaxial cable 503 is used in the example shown in FIG. 1, it is difficult to achieve the miniaturization of a portion where the coaxial cable 503 is used. In addition, since an internal circuit of the IC package and the coaxial cable should be connected to each other while sealing is ensured, the manufacturing cost of the entire package is increased.

In addition, in the second and third examples shown in FIG. 2 and FIG. 3, respectively, the gold (Au) wire 8 or the leads 9 are used. However, in the case of the gold (Au) wire 8 or the leads 9, impedance is mismatched so that the high frequency properties may be degraded. It is general practice that the properties are influenced if the length of the impedance mismatching part exceeds approximately one twentieth (1/20) of a wavelength. For example, in a case of 40 GHz, it is preferable that the length of the gold (Au) wire 8 or the lead 9 be equal to or less than 0.37 mm. Because of this, in the high frequency case, it is difficult to cancel (compensate for) the position shift of the printed wiring board 6 and the optical component 7 so as to connect the printed wiring board 6 and the optical component 7 to each other by the gold (Au) wire 8 or the leads 9.

Because of this, recently, an example shown in FIG. 4 has been suggested. FIG. 4 is a schematic view showing a first related art example of the driver IC package having the compound semiconductor IC and the optical component connected by a flexible board.

In the example shown in FIG. 4, the printed wiring board 6 having the main surface where the high frequency device 5 shown in FIG. 2 and an optical device 27 are connected to each other by a flexible board 504 so that high frequency signal lines are connected to each other. The flexible board 504 is made of, for example, polyimide so that impedance of the flexible board 504 is controlled.

Meanwhile, in an optical component used for transmission of signals with a transmission rate of 16 Gbps, where the flexible board is used for the connection part, "10 Gbit/s Miniature Device Multi Source Agreement (XMD-MSA)" is the standard.

In addition, the following structure has been also suggested. That is, a ground electrode, a signal electrode, and a power source electrode are mounted on the surface of an MIC (Microwave Integrated Circuit) bonded to a base. A ground lead, a signal lead and a power lead are connected by thermocompression to the corresponding electrodes. On the base, molten resin is dripped over the MIC and hardened to seal the MIC. (See, for example, Japanese Laid-Open Patent Application Publication No. 10-41420).

However, in the example shown in FIG. 4, as the transmission speed is higher such as more than 10 Gbps, it is difficult to secure high frequency properties at a connection part of the IC package 505 and the printed wiring board 6, a connection part of the printed wiring board 6 and the flexible board 504, and a connection part of the flexible board 504 and the optical component 27. Hence, it is necessary to decrease the number of the connection parts.

In particular, in a case of a high speed IC package whereby signals having transmission rate equal to or greater than 40 Gbps can be transmitted, it is preferable to use an IC package having a flexible connection part so that the number of the connection parts is decreased while degradation of the high frequency properties due to the position shift of the printed wiring board 6 and the optical component 27 is prevented.

However, there is no flexible board having good high frequency properties and sealing abilities such as polyimide in the related art. Hence, it is difficult to use the flexible board for the IC package of the compound semiconductor requiring the sealed environment.

In addition, in the example suggested in Japanese Laid-Open Patent Application Publication No. 10-41420, although the flexible board is used as an interposer, the sealing ability of the flexible board itself is low. Hence, a sealable cavity structure is not applied and polyimide resin is used for sealing. Accordingly, high frequency properties of the compound semiconductor cannot be effectively achieved.

In addition, a package has been suggested where a rigid board is used as an interposer and a sealing structure is formed by a lid part made of resin or ceramic so as to form a space inside the lid part. However, in a case of the rigid board unlike the flexible board, the position shift between the printed board 6 and the optical component cannot be cancelled. Hence, it is necessary to connect the flexible board outside the package.

Because of this, it is difficult to avoid a problem of degradation of the high frequency properties at the connection part.

SUMMARY OF THE INVENTION

Accordingly, embodiments of the present invention may provide a novel and useful electronic component package solving one or more of the problems discussed above.

More specifically, the embodiments of the present invention may provide an electronic component package wherein an electronic component such as a compound semiconductor IC requiring a sealed environment is sealed so that high frequency properties are improved.

The embodiments of the present invention may also provide an electronic component package whereby a position shift with a connection subject of the package is cancelled with a simple structure so that degradation of the high frequency properties at the connection part based on the position shift can be prevented.

One aspect of the present invention may be to provide an electronic component package, including a film board where an electronic component is mounted, and a lid part mounted on the film board so as to cover a surface of the film board. The electronic component is provided in a cavity formed by the film board and the lid part, and the electronic component is connected to a signal wiring conductor formed at the film board.

According to the embodiment of the present invention, it is possible to provide an electronic component package wherein an electronic component such as a compound semiconductor IC requiring a sealed environment is sealed so that high frequency properties are improved. According to the embodiment of the present invention, it is also possible to provide an electronic component package whereby a position shift with a connection subject of the package is cancelled with a simple structure so that degradation of the high frequency properties at the connection part based on the position shift can be prevented.

Other objects, features, and advantages of the present invention will become more apparent from the following detailed description when read in conjunction with the accompanying drawings.

DETAILED DESCRIPTION OF THE PREFERRED EMBODIMENTS

A description is given below, with reference to the FIG. 5 through FIG. 21 of embodiments of the present invention.

Figure 5:
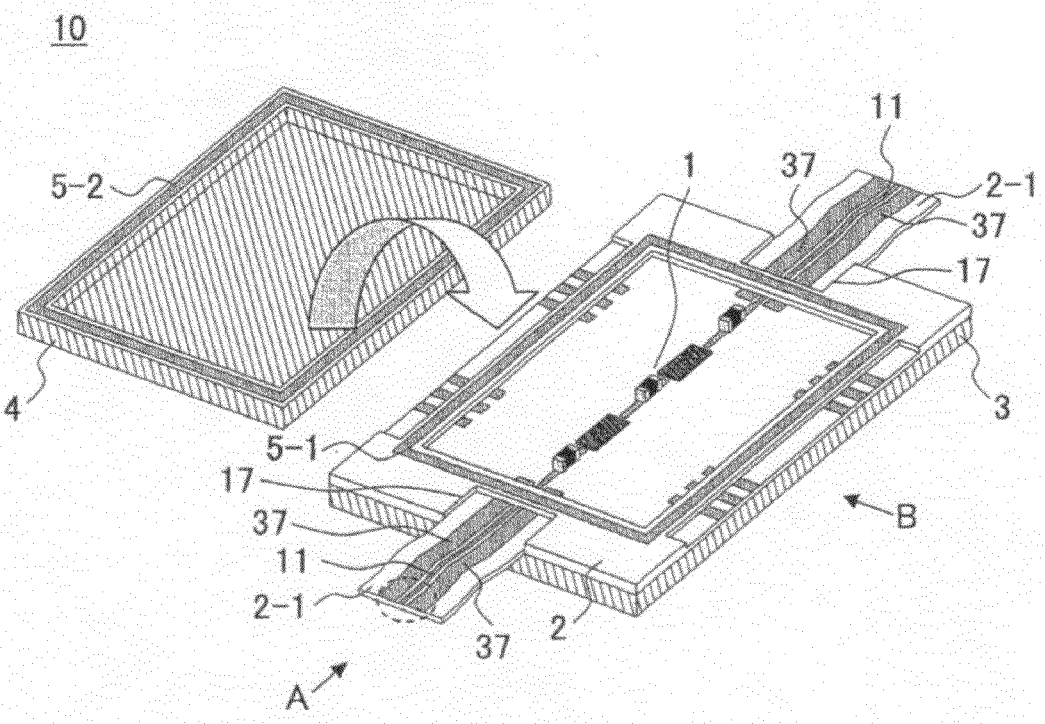
FIG. 5 is a perspective view of an electronic component package of an embodiment of the present invention.

FIG. 5 is a perspective view of an electronic component package of an embodiment of the present invention. In FIG. 5, a lid part 4 is laid open to reveal internal parts.

Referring to FIG. 5, an electronic component 10 of the embodiment of the present invention includes a film board 2 having a main surface where an IC component 1 is mounted, a plane plate 3 adhered to a rear surface of the film board 2, and the lid part 4 configured to cover a surface of the film (flexible) board 2.

The film board 2 is a flexible film board using liquid crystal polymer as an insulator. A circuit is patterned on the film board 2. Copper foil 5-1 is provided at a part contacting the lid part 4 when the lid part 4 is mounted on a surface of the film board 2.

The IC component 1, for example, a compound semiconductors IC such as GaAs (gallium arsenide) or InP (indium phosphide) having high frequency properties is mounted on the surface of the film board 2. A signal line and a terminal of the IC component 1 are connected to a circuit such as a high frequency signal line formed on the film board 2 by a well-know bonding wire method.

As discussed below, in this example, gold (Au) plating 12 (see FIG. 8) as a metal for ground is provided on substantially the entire rear surface of the film board 2.

Concave parts 17 are formed substantially in the center of two sides among four sides forming the external configuration of the film board 2. Flexible connection parts 2-1 are provided so as to be pulled out from the concave parts 17 of the film board 2 to outside of the electronic component package 10. Liquid crystal polymer is used as an insulator of the flexible connection parts 2-1. Ground conductors 37 made of copper foil are provided on the surface of the flexible connection parts 2-1. High frequency signal wiring conductors 11 are sandwiched by the ground conductors 37 and exposed. The flexible connection parts 2-1 have flexibility and can cancel the position shift with the connection subject outside of the package with high precision.

Here, the structure of a transmission line of the flexible connection part 2-1 is discussed with reference to FIG. 6. Here, FIG. 6 is a view showing the structure of the transmission line of the flexible connection part 2-1 and is a schematic view of a part surrounded by a dotted line of the flexible connection part 2-1 seen from a direction indicated by an arrow A in FIG. 5.

Figure 6:
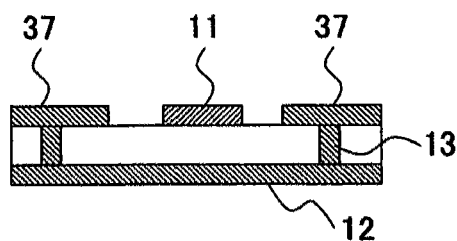
FIG. 6 shows a structure of a transmission line of a flexible connection part and is a view of the flexible connection part seen from a direction indicated by an arrow A in FIG. 5.

As shown in FIG. 6, the high frequency signal wiring conductor 11 is sandwiched by the ground conductors 37 with designated gaps on a surface of the flexible connection part 2-1 of this example. In this example, the flexible connection part 2-1 has a so-called GCPW (Grounded Coplanar waveguide) type transmission line structure. In the GCPW type transmission line structure, the ground conductors 37 are connected to the ground conductor 12 provided on a rear surface of the flexible connection part 2-1. Since the ground conductor 12 is provided on the rear surface of the flexible connection part 2-1, good ground stability can be achieved.

In addition, the impedance of the transmission line is controlled so as to have a designated value such as 50Ω.

Figure 7:
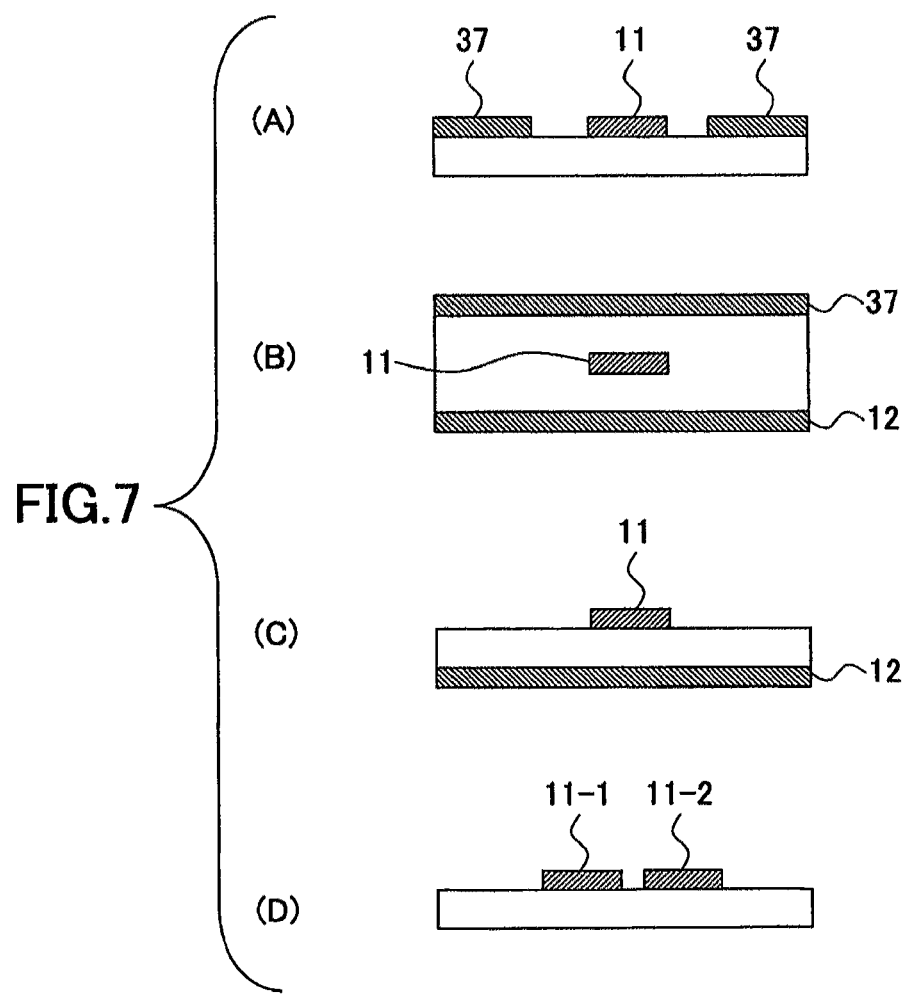
FIG. 7 is a view showing an example of the transmission line structure of the flexible connection part.

As long as the impedance of the transmission line is controlled so as to have a designated value, the structure of the transmission line is not limited to the structure shown in FIG. 6. For example, the transmission line may have a structure shown in FIG. 7. Here, FIG. 7 is a view showing an example of the transmission line structure of the flexible connection part 2-1.

As shown in FIG. 7(A), the flexible connection part 2-1 may have a so-called CPW (Coplanar Waveguide) type transmission line structure. In the CPW type transmission line structure, the high frequency signal wiring conductor 11 is sandwiched by the ground conductors 37 via designated gaps on the surface of the flexible connection part 2-1. Under this structure, since signals can be transmitted by using only a single surface of the flexible connection part 2-1, it is possible to easily connect the flexible connection part 2-1 to a circuit of a connection subject outside of the package.

In addition, as shown in FIG. 7(B), the flexible connection part 2-1 may have a so-called strip line type structure. In this structure, the ground conductor 37 is provided on a surface of the flexible connection part 2-1 and the ground conductor 12 is provided on a rear surface of the flexible connection part 2-1. The high frequency signal wiring conductor 11 is provided inside the flexible connection part 2-1 and sandwiched by the ground conductors 37 and 12 in a thickness direction, namely an upper and lower direction in FIG. 7(B).

Furthermore, as shown in FIG. 7(C), the flexible connection part 2-1 may have a so-called micro strip line type structure. In this structure, the high frequency signal wiring conductor 11 is provided on a surface of the flexible connection part 2-1 and the ground conductor 12 is provided on the rear surface of the flexible connection part 2-1.

In addition, as shown in FIG. 7(D), the flexible connection part 2-1 may have a parallel line type structure. In this structure, a plus signal wiring conductor 11-1 and a minus signal wiring conductor 11-2 are provided on a surface of the flexible connection part 2-1 so that a balanced signal can be transmitted.

Referring back to FIG. 5, the plane plate 3 made of, for example, metal such as copper (Cu) or ceramic is adhered on the rear surface of the film board 2 by solder or silver epoxy. The lid part 4 is provided on a surface of the film board 2 so as to cover the surface of the film board 2. The lid part 4 is made of, for example, metal such as copper (Cu) or ceramic.

Since the metal and ceramic have higher sealabilities than resin such as polyimide, it is possible to form a sealed environment of the IC component 1 such as a compound semiconductor IC mounted on the film board 2 with high precision.

A material for the lid part 4 is properly selected based on the size or the like of the electronic component package. It is preferable to select a material having a coefficient of thermal expansion close to that of the film board 2, as the material of the lid part 4. In addition, in order to prevent generation of cavity resonance inside the cavity under the lid part 4, it is effective to provide an electromagnetic wave absorbing material inside or outside the lid part 4.

Copper foil 5-2 is mounted at a portion corresponding to the copper foil 5-1 provided on a part of the surface of the film board 2 where the lid part 4 comes in contact with the film board 2 when the lid part 4 is mounted on the surface of the film board 2. The area of the copper foil 5-1 on the surface of the film board 2 is greater than the area of the copper foil 5-2 on the lid part 4.

The lid part 4 having the above-mentioned structure is mounted on the film board 2 so as to cover the surface of the film board 2. The copper foil 5-2 provided on the lid part 4 and the copper foil 5-1 provided on the film board 2 are connected to each other by silver (Ag), solder, or the like. Accordingly, it is possible to securely seal the cavity between the lid part 4 and the film board 2 from the outside. As a result of this, the film board 2 is sandwiched by the plane plate 3 and the lid part 4 in the thickness direction of the film board 2 so that the electronic component package 10 is completed.

Figure 8:
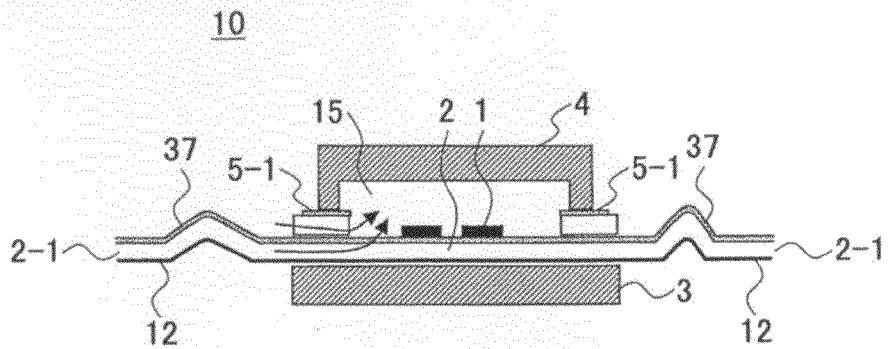
FIG. 8 is a schematic view of the electronic component package seen from a direction indicated by an arrow B in FIG. 5.

In FIG. 8, the electronic component package 10 is seen from a direction indicated by an arrow B in FIG. 5.

Referring to FIG. 8, in the electronic component package 10, a cavity forming part 15 is formed between the film board 2 and the lid part 4. The lid part 4 has a cross-section having the configuration of a rectangle without one side (inverted U-shape). This IC component 1 such as a compound semiconductor IC is mounted on the film board 2 and sealed in the cavity 15.

Figure 1:
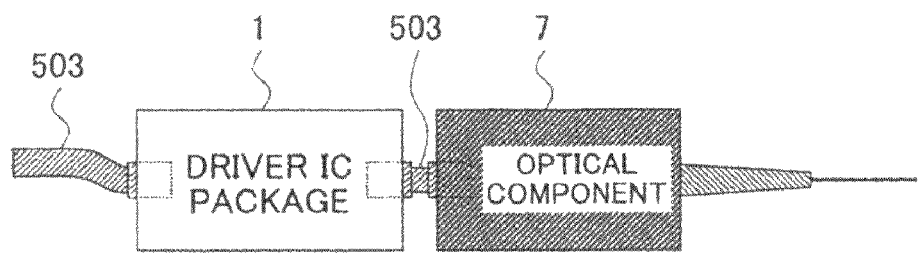
FIG. 1 is a schematic view showing a first related art example of a driver IC package having a compound semiconductor IC and an optical component.
Figure 2:
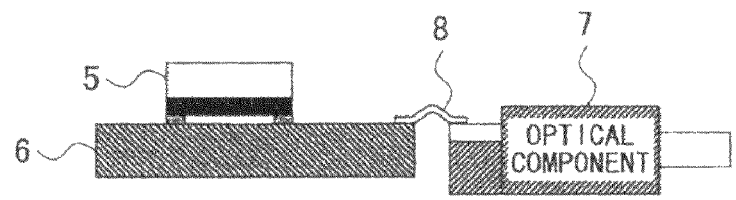
FIG. 2 is a schematic view showing a second related art example of a driver IC package having a compound semiconductor IC and an optical component.
Figure 3:
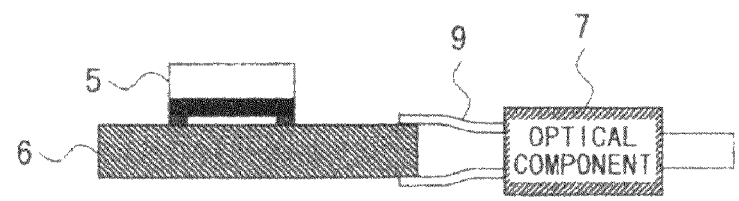
FIG. 3 is a schematic view showing a third related art example of a driver IC package having a compound semiconductor IC and an optical component.
Figure 4:
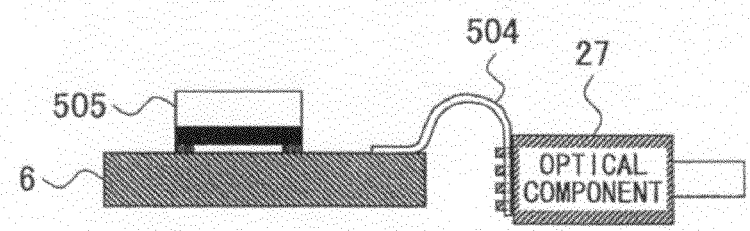
FIG. 4 is a schematic view showing a first related art example of a driver IC package having a compound semiconductor IC and an optical component connected by a flexible board.

In the meantime, as discussed with reference to FIG. 4, an example where the printed wiring board 106 and the optical component 27 are connected to each other via the flexible board 504 made of polyimide has been suggested. On the other hand, in this FIG. 8 example, as discussed above, the film board 2 is a flexible board where liquid crystal polymer is used as an insulator.

It is possible to make the liquid crystal polymer have a coefficient of thermal expansion substantially equal to that of copper (Cu). Hence, it is possible to form a configuration, like a normal printed wiring board, where copper (Cu) is adhered on both surfaces of the film. Because of this, it is possible to form a circuit (pattern) on a printed wiring board. Hence, the liquid crystal polymer can be used as an interposer for the IC package.

The dielectric constant indicating the high frequency properties of the liquid crystal polymer, as well as polyimide, is small, approximately 3. The dielectric loss tangent (tan δ) of the liquid crystal polymer is substantially equal to the dielectric loss tangent (tan δ) of the polyimide and has a low value (on the order of $10^{-3}$). Absorption of the liquid crystal polymer is low, approximately one to several tenths of the absorption of polyimide. A publication shows measured values of absorption of a flexible board made of liquid crystal polymer and a flexible board made of polyimide in a test defined at "IPC TM-650 2.6.2" where the flexible board made of liquid crystal polymer and the flexible board made of polyimide are immersed in water having temperature of 25° C. for 24 hours and amounts of water absorbed by the boards are measured. The absorption of the flexible board made of polyimide is 1.6 wt % and the absorption of the flexible board made of liquid polymer is in the range 0.04 through 0.1 wt %.

Here, problems in a case where the absorption is high such as the case of the flexible board made of polyimide are discussed with reference to FIG. 9. Here, FIG. 9 is a view for explaining problems in a case where a film board made of a material having a high absorption is used.

Figure 9:
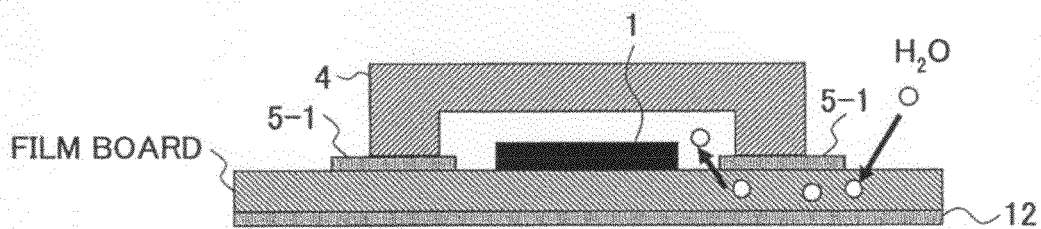
FIG. 9 is a view for explaining problems in a case where a film board made of a material having a high absorption rate is used.

Referring to FIG. 9, in a case where the film board of the electronic component package inside which the cavity forming part 15 is formed is made of a material having high absorption such as polyimide, the film board absorbs a large amount of moisture ($H_2O$) from outside and discharges the moisture ($H_2O$) inside the package, more specifically, in the cavity forming part 15. Accordingly, it is not necessary to securely seal the cavity 15 so that this film board cannot be used for the package of the electronic component such as the compound semiconductor IC requiring high sealability. If the film board absorbs a large amount of outside moisture ($H_2O$), the dielectric loss tangent (tan δ) of the film board becomes large so that the high frequency properties are degraded and loss of signal in the high frequency range become large.

On the other hand, if the film board like the film board 2 in the embodiment of the present invention is made of the liquid crystal polymer, since the absorption is low such as approximately one to several tenths the absorption of polyimide, the above-mentioned problems may not be generated.

That is, since the film board made of liquid crystal polymer does not absorb a large amount of outside moisture ($H_2O$), the amount of the moisture ($H_2O$) to be discharged in the cavity forming part 15 in a direction indicated by an arrow in FIG. 8 is extremely small. Accordingly, the liquid crystal polymer is preferable for the package of the electronic component such as the compound semiconductor IC requiring high sealability. In addition, it is possible to avoid generation of the position shift or degradation of the high frequency properties due to large absorption of the outside moisture ($H_2O$) by the film board 2.

Furthermore, in this embodiment, the copper foil 5-1 and the copper foil 5-2 are provided at parts where the lid part 4 and the film board 2 come in contact with each other when the lid part 4 is mounted on a surface of the film board 2. The copper foils 5-1 and 5-2 are connected to each other by silver (Ag) epoxy, solder, or the like. Hence, it is possible to securely seal the cavity 15 between the lid part 4 and the film board 2 from the outside.

Especially, as discussed above, the area of the copper foil 5-1 on a surface of the film board 2 is greater than the area of the copper foil 5-2 on the lid part 4. On the surface of the film board 2, the copper foil 5-1 is provided inside a portion where the lid part 4 is provided. Accordingly, it is possible to securely prevent the film board 2 from absorbing the outside moisture ($H_2O$) and discharging the moisture ($H_2O$) to the cavity forming part 15. The inventors of the present invention analyzed leakage of helium (He) into the cavity forming part 15 in the electronic component package 10 having the above-discussed structure after pressure was applied for three hours in about 2.2 kPA (2 atm). The leakage of helium (He) was 1.2E-10 atm·cc/s. According to gas analysis after 172 hours has passed under the conditions of temperature of 185° C. and moisture of 85%, 0.41 volume % of moisture ($H_2O$) was found. Thus, a good result was achieved.

If prevention of leakage of the moisture ($H_2O$) or the like into the cavity 15 is strictly required depending on the intended use of the electronic component package, the area of the copper foil 5-1 on the surface of the film board 2 may be greater than the area of the copper foil 5-2 at the lid part 4 and the copper foil 5-1 may be placed further inside the portion where the lid part 4 is provided.

The inventors of the present invention analyzed leakage of helium (He) into the cavity forming part 15 in the electronic component package where the copper foil 5-1 is provided on the entire surface of the film board 2 after pressure was applied for three hours at 2 atm. The leak of helium (He) was 1.8E-10 atm·cc/s. According to gas analysis after 172 hours passed under the conditions of temperature of 185° C. and moisture of 85%, 0.08 volume % of the moisture ($H_2O$) was found.

In addition, since the copper foil is adhered on the entire rear surface of the film board 2 and the gold plating 12 is applied, discharge of the moisture ($H_2O$) from the rear surface of the film board 2 into the cavity forming part 15 was prevented.

Thus, in this embodiment, since the flexible connection part is provided in the IC package, it is possible to decrease the number of the connection parts which cause degradation of the high frequency properties. In addition, the film board 2 can cancel the effect of the position shift with the connection subject outside of the package with high precision. Hence, it is possible to prevent degradation of the high frequency properties due to such position shift. Especially, since the film board 2 is made of liquid crystal polymer, the absorption of the film board 2 is low and it is possible to provide secure sealing. Hence, it is possible to avoid the degradation of the high frequency properties due to large absorption of the outside moisture ($H_2O$) by the film board 2. In addition, since the dielectric loss tangent (tan δ) of the film board 2 is low, it is possible to achieve good high frequency properties.

Figure 10:
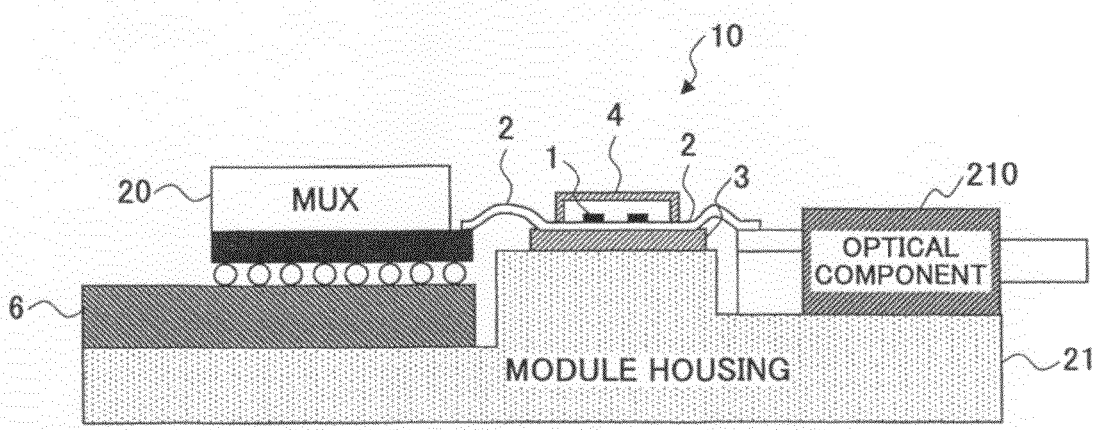
FIG. 10 is a schematic view showing a state where an electronic component package of an embodiment of the present invention that is mounted in a module or the like such as an optical transceiver.

The electronic component package 10 having the above-discussed structure can be mounted in a module such as an optical transceiver as shown in FIG. 10. Here, FIG. 10 is a schematic view showing a state where an electronic component package of an embodiment of the present invention that is mounted in a module or the like such as an optical transceiver.

Referring to FIG. 10, the electronic component package 10 having the above-discussed structure is mounted on a module housing 21. The film boards 2 extending from the electronic component package 10 are connected to an MUX (multiplexer) 20 mounted on the printed wiring board 6 and an optical component 210.

With this structure, the driver IC packages 1 having the compound semiconductor ICs can be sealed with high sealability by using the electronic component package 10 having the film boards 2 made of crystal liquid polymer. Even if there is a position shift of the MUX (multiplexer) 20 or the optical component 210, it is possible to cancel the position shift and connect the MUX 20 and the optical component 210 by the film boards 2. Hence, it is possible to prevent degradation of the high frequency properties due to degradation of sealability and the position shift.

Next, a modified example of the electronic component package 10 shown in FIG. 5 is discussed with reference to FIG. 11 through FIG. 14.

Figure 11:
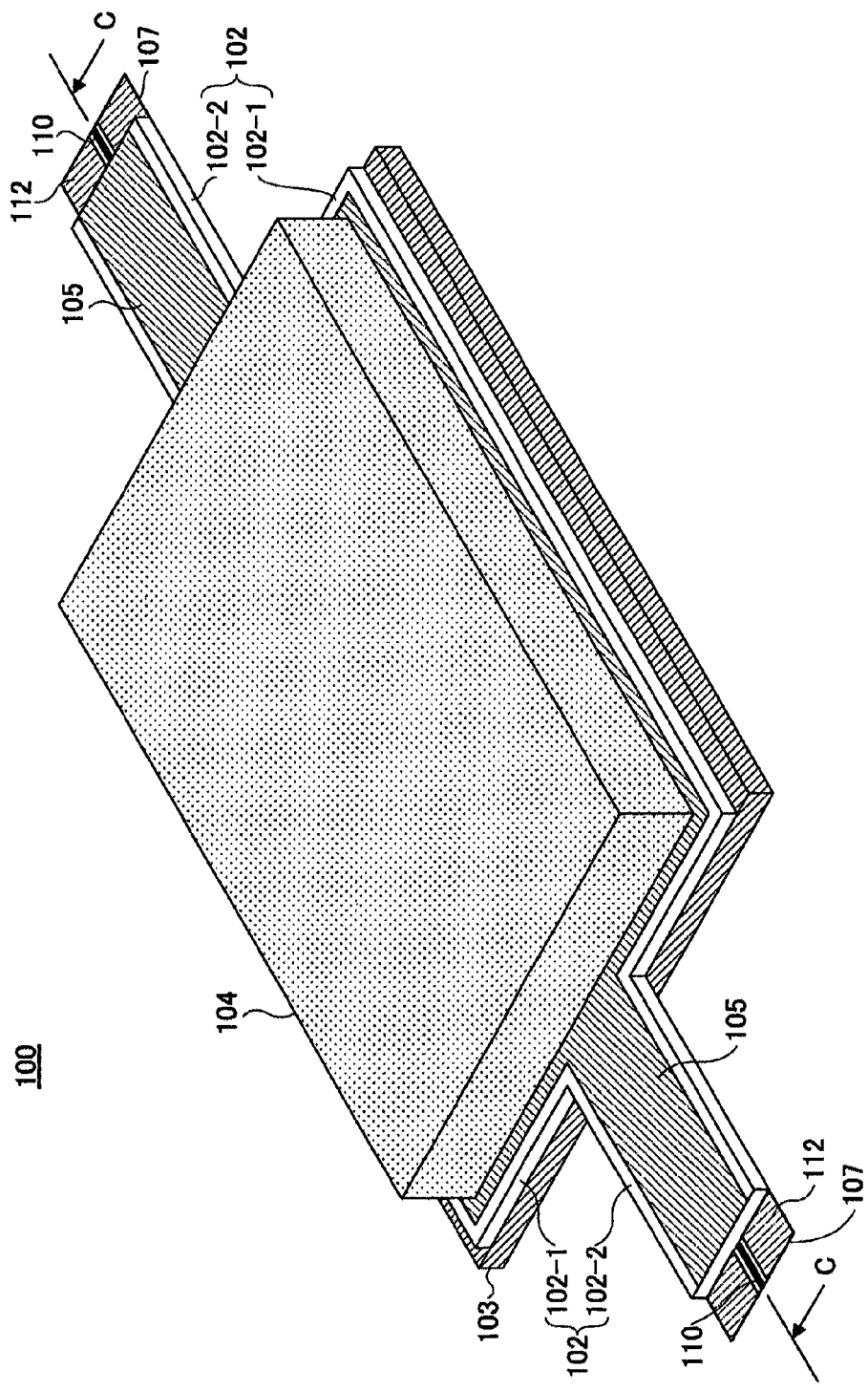
FIG. 11 is a perspective view showing the upper external appearance of an electronic component package of a modified example of the electronic component package shown in FIG. 5.
Figure 12:
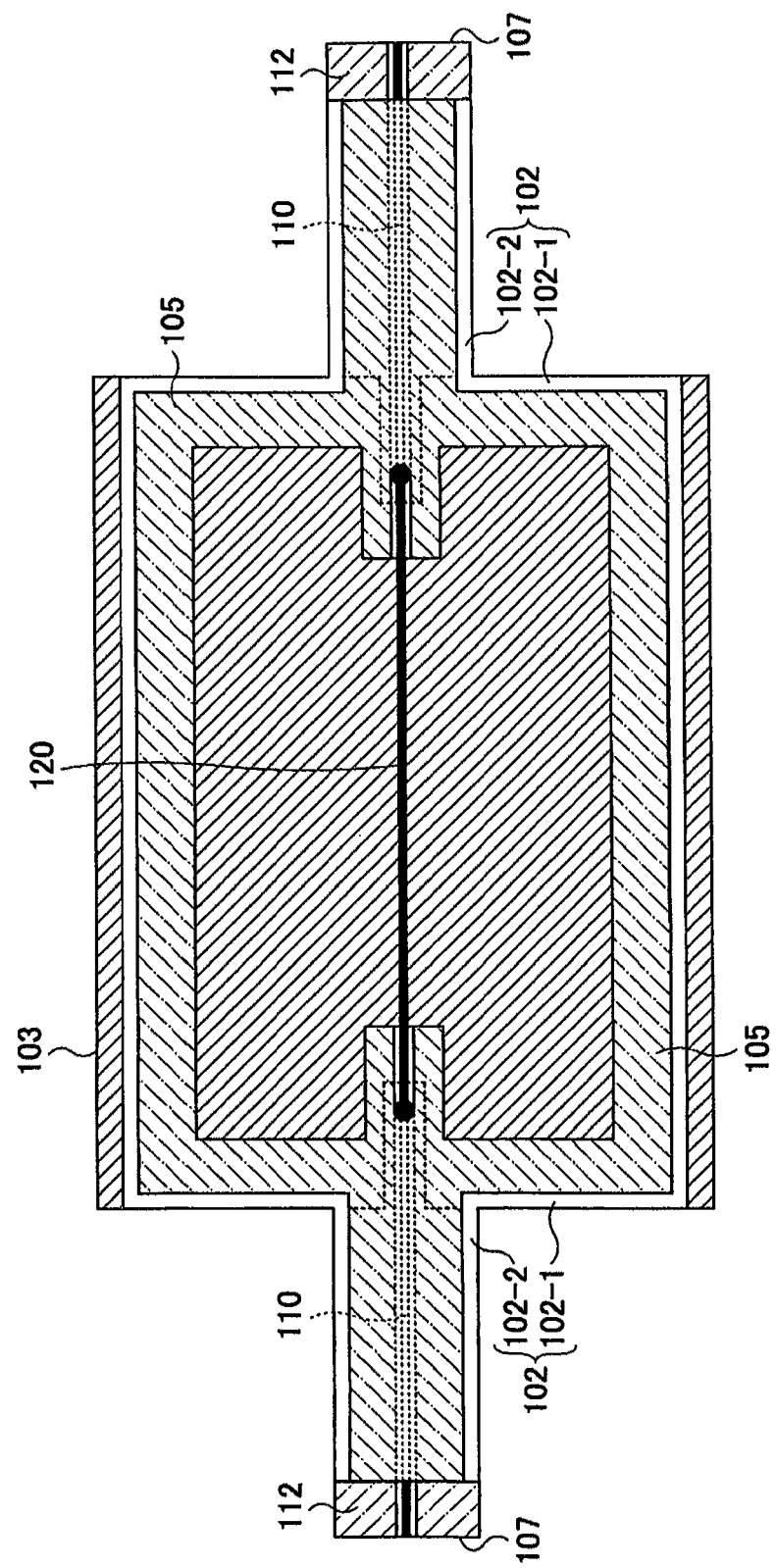
FIG. 12 is a plan view of the electronic component package shown in FIG. 11 in a state where a lid part is removed.
Figure 13:
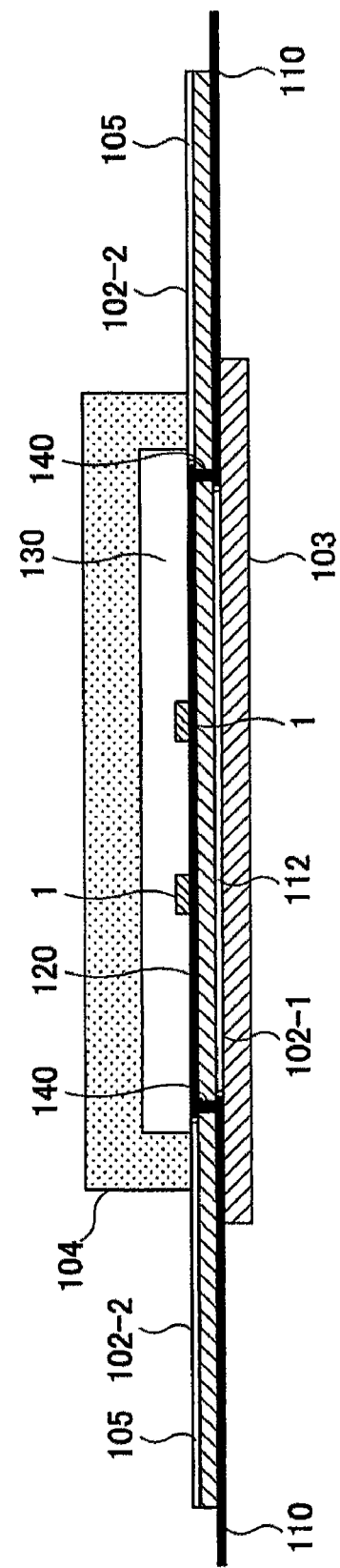
FIG. 13 is a cross-sectional view of the electronic component package taken along a line C-C of FIG. 11.

First, FIG. 11 through FIG. 13 are referred to. Here, FIG. 11 is a perspective view showing the upper external appearance of an electronic component package 100 of a modified example of the electronic component package 10 shown in FIG. 5. FIG. 12 is a plan view of the electronic component package 100 shown in FIG. 11 in a state where a lid part 104 is removed. FIG. 13 is a cross-sectional view of the electronic component package 100 taken along a line C-C of FIG. 11.

The electronic component package 100 includes a film board 102, a plane plate 103, a lid part 104, and others. The film board 102 includes a film board main body part 102-1 and connection parts 102-2. The film board main body part 102-1 has a main surface having a substantially rectangular shaped configuration. The connection parts 102-2 extend to outside of the electronic component package 100 substantially at the centers of two sides among four sides forming the external configuration of the film board main body 102-1. The plane plate 103 is adhered to the rear surface of the film board main body part 102-1. The lid part 104 is provided so as to cover the surface of the film board main body part 102-1.

The film board 102, as well as the film board 2 shown in FIG. 5, is a flexible film board where liquid crystal polymer is used as an insulator. A circuit is patterned on the film board 102. The plane plate 103 and the lid part 104, as well as the plane plate 3 and the lid part 4 shown in FIG. 5, are made of ceramic or metal such as copper (Cu).

The IC components 1 (see FIG. 13) such as the compound semiconductor ICs are mounted, by a mounting method as discussed below, on a portion of the surface of the film board main body part 102-1 covered by the lid part 104.

In addition, copper foil 105 is provided on the surfaces of the connection parts 102-2, a portion of the surface of the film board main body part 102-1 where the lid part 104 comes in contact, and inside and outside parts of the portion of the surface of the film board main body part 102-1. Copper foil is also provided on a surface of the lid part 104 coming in contact with the film board main body part 102-1. The copper foil provided on the lid part 104 and the copper foil 105 provided on the film board main body part 102-1 are connected to each other by silver, solder, or the like. Accordingly, it is possible to securely seal a cavity 30 formed between the lid part 104 (see FIG. 13) and the film board 102 from the outside.

A film board rear surface part 107, on the entire surface of which gold plating 112 as a ground metal is applied, is provided on rear surfaces of the film board main body part 102-1 and the connection parts 102-2. The film board rear surface part 107 extends outward from edge parts of the connection parts 102-1.

First signal wiring conductors 110 are provided from the portion of the film board rear surface parts 107 extending outward from the edge parts of the connection parts 102-2 toward the film board main body 102-1. The first signal wiring conductors 110 are exposed to the outside. Portions of the first signal wiring conductors 110 not exposed to the outside are indicated by dotted lines in FIG. 12.

At least one (in the example shown in FIG. 11, both) portions of the connection parts 102-2 where the first signal wiring conductors 110 exposed to the outside are provided have flying lead configurations. In other words, circuits (patterns) of the film board 102 such as the first signal wiring conductors 110 extend from the film board main body part 102-1 to the outside so as to connect to the connection subject of the electronic component package 100 such as a board made of ceramic. As discussed above, the gold plating 112 is applied to the parts of the rear surfaces of the connection parts 102-2 (via the film board rear surface part 107) where the first signal wiring conductors 110 exposed to the outside are provided so that the first signal wiring conductors 110 are connected to, by thermo-compression bonding or the like, the board made of ceramic which is the connection subject having a surface where gold plating is applied.

The second signal wiring conductor 120 (see FIG. 12) is provided on the surface of the film board main body part 102-1 in the cavity 130 formed between the film board 102 and the lid part 104 having the cross-sectional configuration of a rectangle without one side, in a direction same as the first signal wiring conductor 110. The IC components 1 (see FIG. 13) such as the compound semiconductor ICs or the like are connected to the second signal wiring conductor 120.

Figure 14:
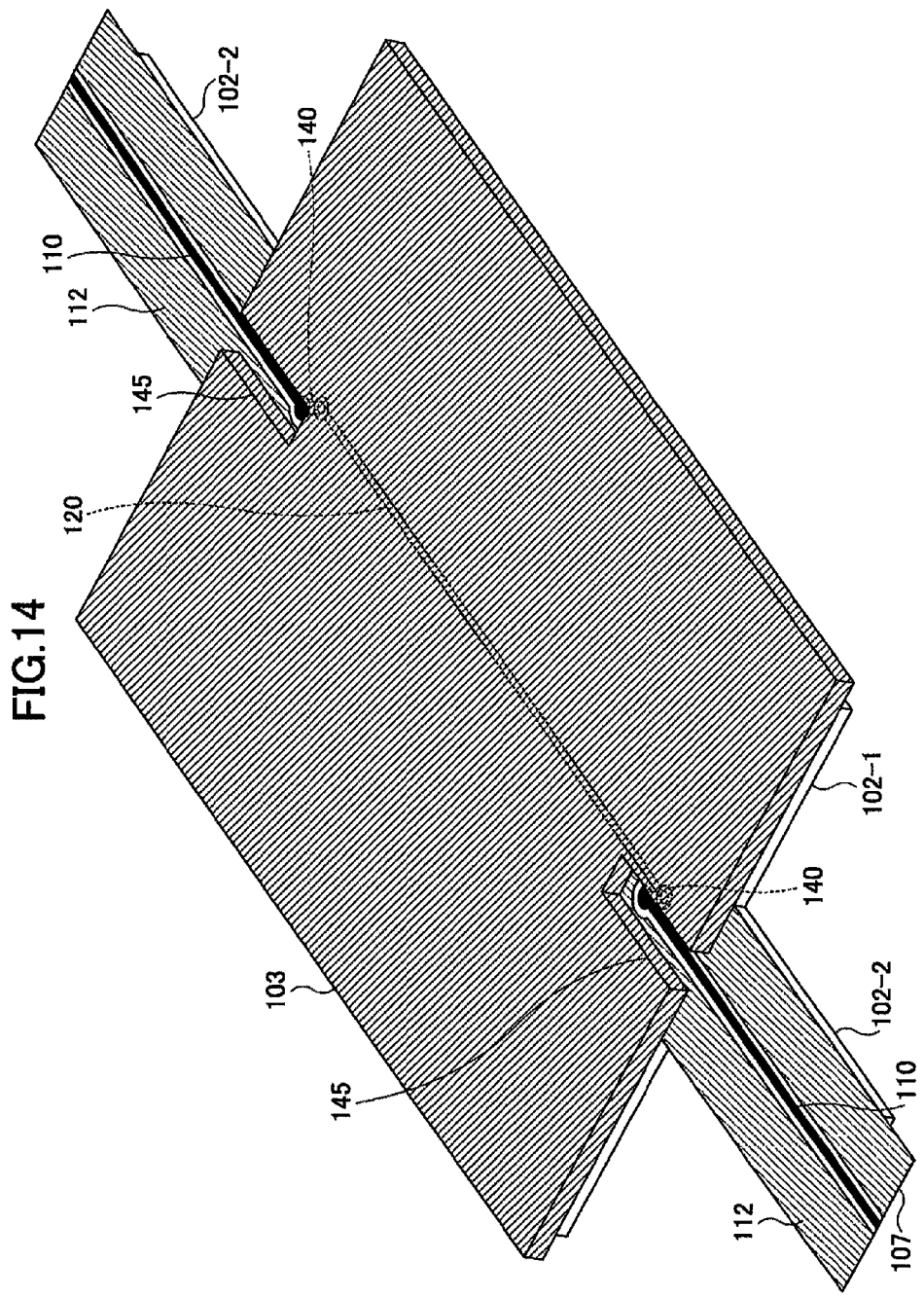
FIG. 14 is a perspective view showing the lower external appearance of the electronic component package shown in FIG. 11.

Here, the structure of connection between the first signal wiring conductor 110 and the second signal wiring conductor 120 is discussed with reference to FIG. 14 in addition to FIG. 13. FIG. 14 is a perspective view showing the lower external appearance of the electronic component package shown in FIG. 11. Illustration of the lid part 104 shown in FIG. 11 is omitted in FIG. 14.

As shown in FIGS. 12 and 13, the first signal wiring conductors 110 formed on the film board rear surface part 107 extends from the edge parts of the film board rear surface part 107 toward the film board main body part 102-1 so as to reach inside a portion where the film board main body part 102-1 and the lid part 104 come in contact with each other. The second signal wiring conductor 120 is provided on the surface of the film board main body part 102-1 so as to connect the first signal wiring conductors 110 to each other at corresponding positions neat the edge parts of the film board main body part 102-1. The second signal wiring conductor 120 is indicated by a dotted line in FIG. 14.

The first signal wiring conductors 110 and the second signal wiring conductor 120 are connected to each other by via holes 140. The via holes 140 are configured to connect the (upper) surface and the rear surface of the film board main body part 102-1 to each other.

Accordingly, a double layer structure is formed where a layer of the first signal wiring conductors 110 and a layer of the second signal wiring conductor 120 are different from each other in the height direction is formed.

The via holes 140 can be formed by a well-known method. For example, the via holes 140 may be formed by forming holes in the film board 102 using lasers or mechanically and applying plating to entirely fill the holes to provide conductivity. Alternatively, the via holes 140 may be formed by stacking layers where holes are formed by laser or the like and filling the holes with metal paste.

Furthermore, in this example, as shown in FIG. 14, groove forming parts 145 pierce the plane plate 103 in the height direction. More specifically, the groove forming parts 145 are formed at parts of the plane plate 103 facing parts of the rear surface of the film board main body part 102-1 where ends of the first signal wiring conductors 110 are formed. Hence, the first signal wiring conductors 110 are exposed to the lower side of the electronic component package 100 (the upper side of the electronic component package 100 in FIG. 14 because FIG. 14 is a perspective view showing the lower external appearance of an up-side down state of the state shown in FIG. 11 of the electronic component package shown in FIG.

11). Therefore, it is possible to prevent the first signal wiring conductors 110 from coming in contact with the plane plate 103 made of metal or the like.

Sealing member mat be dropped and provided in the vicinities of the via holes 140 such as peripheral parts of the via holes 140 on the rear surface of the film board main body 102-1 exposed by the groove forming parts 145. As a result of this, it is possible to prevent gas from leaking from the vicinities of the via holes 140 such as peripheral parts of the via holes 140 on the exposed rear surface of the film board main body 102-1 to the cavity 130. Hence, it is possible to improve the sealability of the electronic component package 100.

Next, mounting structures of the IC component 1 on the surface of the film board main body part 102-1 are discussed with reference to FIG. 15 through FIG. 18. Here, FIG. 15 through FIG. 18 are schematic views of first through fourth examples of the mounting structure of an IC component 1 on a surface of a film substrate main body part 102-1.

Figure 15:
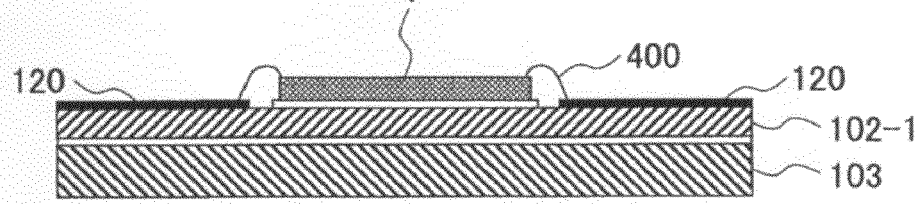
FIG. 15 is a schematic view of a first example of a mounting structure of an IC component 1 on a surface of a film substrate main body part 102-1.

As shown in FIG. 15, the IC component 1 is mounted on the film board main body part 102-1 by solder, silver (Ag) paste, or the like and input and output terminals of the IC component 1 and the second signal wiring conductors 120 of the film board main body part 102-1 are connected to each other by using bonding wires 400 or the like made of gold (Au) or the like.

Figure 16:
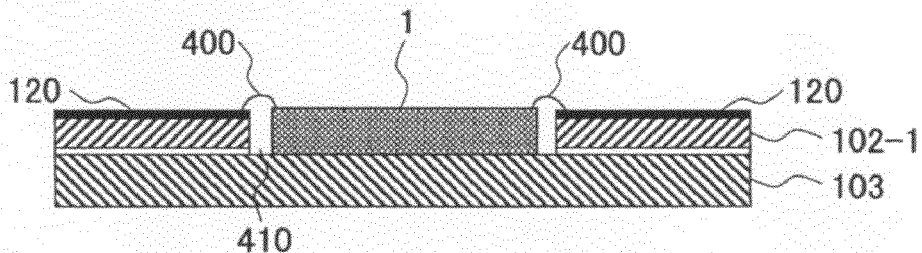
FIG. 16 is a schematic view of a second example of the mounting structure of the IC component 1 on the surface of the film substrate main body part 102-1.

In addition, as shown in FIG. 16, if the thickness of the IC component 1 is large, an IC component mounting hole part 410 having the size substantially equal to that of the IC component may be formed in the film board main body part 102-1 fixed on the plane plate 103, then the IC component 1 may be mounted in the IC component mounting hole part 410 on the plane plate 103. The input and output terminals of the IC component 1 and the second signal wiring conductors 120 of the film board main body part 102-1 can be connected to each other by using bonding wires 400 or the like made of gold (Au) or the like.

Figure 17:
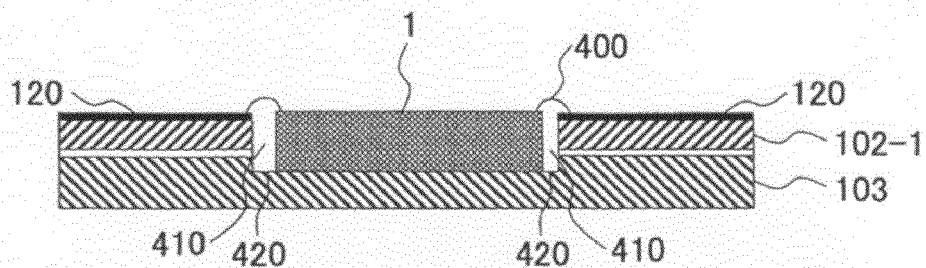
FIG. 17 is a schematic view of a third example of the mounting structure of the IC component 1 on the surface of the film substrate main body part 102-1.

Furthermore, as shown in FIG. 17, in a case where the thickness of the IC component 1 is greater than the thickness of the film board main body part 102-1, the IC component mounting hole part 410 may be formed in the film board main body part 102-1, and an IC component mounting concave part 420 may be formed in the plane plate 103 so as to be in communication with the IC component mounting hole part 410; then IC component 1 may be mounted in the IC component mounting hole part 410 and on the IC component mounting concave part 420. The input and output terminals of the IC component 1 and the second signal wiring conductors 120 of the film board main body part 102-1 can be connected to each other by using bonding wires 400 or the like made of gold (Au) or the like.

In the examples shown in FIGS. 16 and 17, although the IC component 1 is thick, it is possible to make the length of the wires 400 which connect the input and output terminals of the IC component 1 and the second signal wiring conductors 120 of the film board main body part 102-1 to each other equal to the length of the wires 400 shown in FIG. 15. Hence, it is possible to prevent degradation of properties of the IC component 1.

Figure 18:
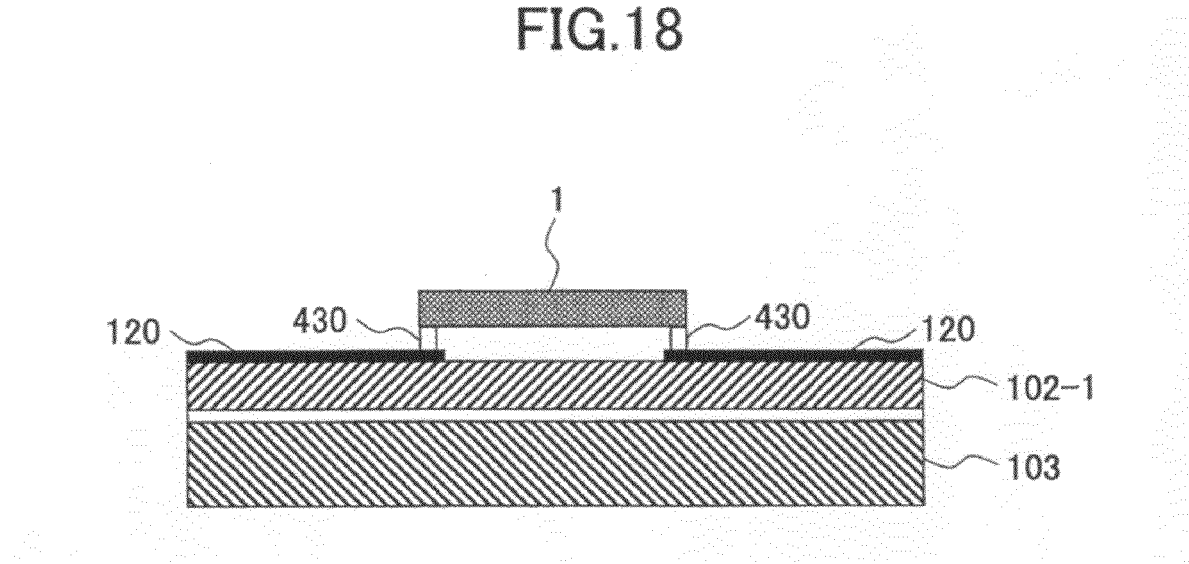
FIG. 18 is a schematic view of a fourth example of the mounting structure of the IC component 1 on the surface of the film substrate main body part 102-1.

In addition, as shown in FIG. 18, connection terminals 430 such as stud bumps made of gold, solder or the like may be provided on a surface of the IC component 1 so that the IC component 1 is flip chip connected to the second signal wiring conductors 120 of the film board main body part 102-1. In the flip chip connection, for example, solder may be melted by heating so that the IC component 1 and the second signal wiring conductors 120 may be connected. Alternatively, the IC component 1 and the film board main body part 102-1 may be connected to each other by gold plating applied to the IC component 1 and the film board main body part 102-1 based on a heating process and application of supersonic waves. In this structure, since wires (see FIG. 15 through FIG. 17) are not used for connecting the IC component 1 and the second signal wiring conductors 120 to each other, it is possible to stably achieve good high frequency properties of the IC component 1 and mass production of the electronic component packages.

As discussed above, in this example, the double layer structure is formed where a layer of the first signal wiring conductors 110 and a layer of the second signal wiring conductor 120 are different from each other in the height direction. In addition, the signal wiring conductors 110 are exposed by the groove forming part 145 formed in the plane plate 103. Hence, it is possible to avoid generation of short circuits due to contact of the film board 102, the lid part 104, or the plane plate part 103 made of metal or the like.

In addition, the film board 102 is made of liquid crystal polymer in this example as well as the examples shown in FIG. 5 through FIG. 10. Hence, it is possible to cancel position shift with the connection subject of the outside of the package with high precision and therefore it is possible to prevent degradation of the high frequency properties due to such a position shift. In addition, the film board 102 does not absorb much of the outside moisture ($H_2O$) and therefore it is possible to avoid position shift or the degradation of the high frequency properties due to such absorption. Furthermore, it is possible to prevent generation of short circuits of the signal wiring conductor without making the structure complex.

Hence, it is possible to provide the IC component 1 such as the compound semiconductor IC on the film board 102 and effectively seal the electronic component 1 in the cavity 130 formed between the film board 102 and the lid part 104 having the cross-sectional configuration of a rectangle without one side.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teachings herein set forth.

Figure 19:
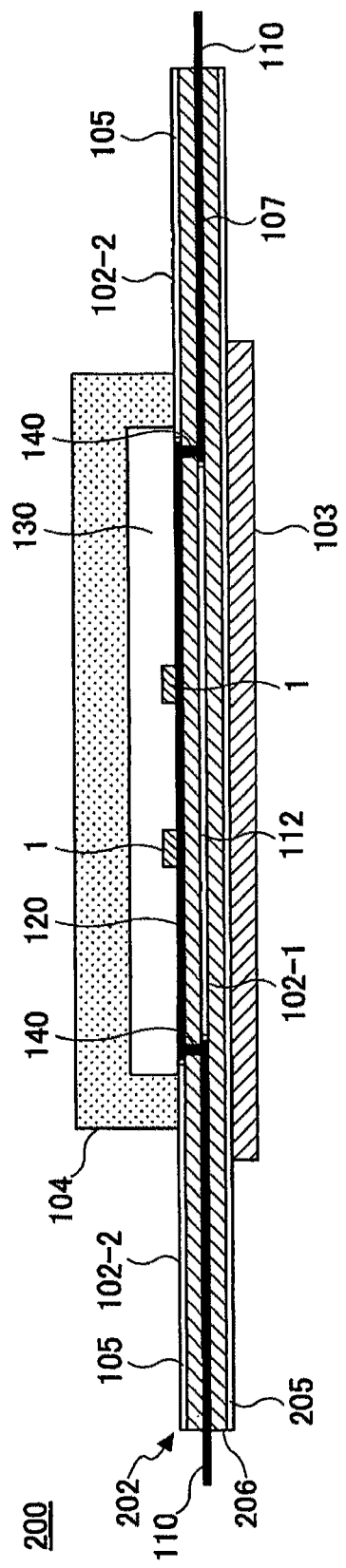
FIG. 19 is a cross-sectional view of an electronic component package having a modified example of the film board shown in FIG. 11.

For example, the film board may have a multi-layer film structure made of liquid polymer like a film board 200 provided in an electronic component package 200 shown in FIG. 19. Here, FIG. 19 is a cross-sectional view of an electronic component package having a modified example of the film board shown in FIG. 11.

Referring to FIG. 19, in this example, in the film board 202, a lower layer film 206 is provided on a film board rear surface part 107, namely rear surfaces of the film board main body part 102-1 and the connection part 102-2. The lower layer film 206 is made of liquid polymer and has a rear surface on the entirety of which copper foil 205 is provided. In this structure, since the copper foil 205 is provided on the entire rear surface of the film board 202, it is possible to prevent gas from leaking into the cavity forming part 130 so that the sealability can be improved.

Although the lid part 4 or 104 is made of ceramic or metal such as copper (Cu) in the above-discussed examples, the present invention is not limited to this. The present invention can be applied to an example where the lid part 4 or 104 is made of ceramic, resin or the like. Such an example is discussed with reference to FIG. 20. Here, FIG. 20 is a cross-sectional view of an electronic component having a lid part 304 made of ceramic or resin.

Figure 20:
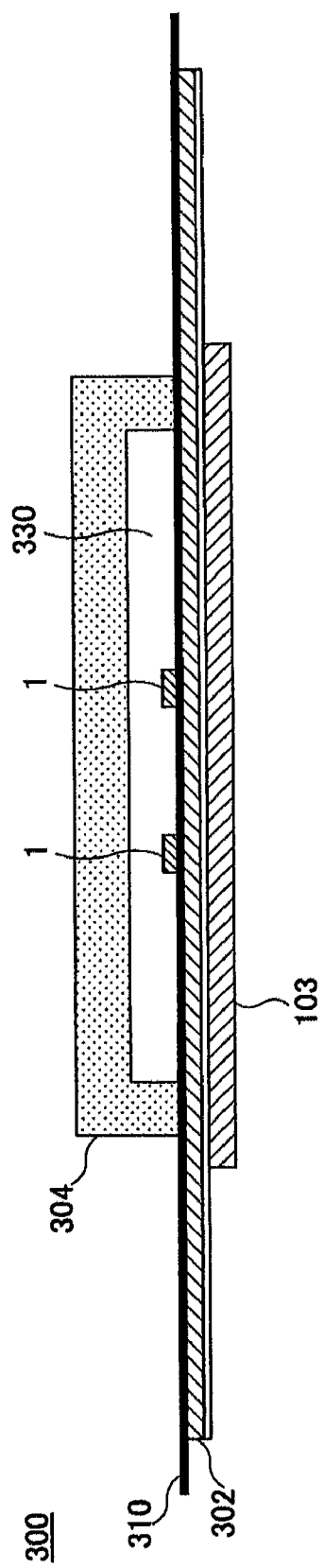
FIG. 20 is a cross-sectional view of an electronic component having a lid part made of ceramic or resin.

In an electronic component package 300 shown in FIG. 20, the lid part 304 is made of ceramic or resin. In addition, a signal wiring conductor 310 is formed on a surface of the film board 302 made of liquid crystal polymer. The plane plate 103 made of ceramic or metal such as copper (Cu) is adhered on the rear surface of the film board 302. In the example shown in FIG. 13, the copper foil provided on the lid part 104 and the copper foil 105 provided on the film board main body part 102-1 are connected to each other by solder, silver, or the like. However, in this example, the lid part 304 is made of ceramic or resin and the signal wiring conductor 310 is formed on the surface of the film board 302. Hence, the film board 302 and the lid part 304 of this example are connected and sealed by epoxy resin or the like as a resin sealing member. With this structure, it is possible to securely seal a cavity 330 between the lid part 304 and the film board 302 from the outside.

Figure 21:
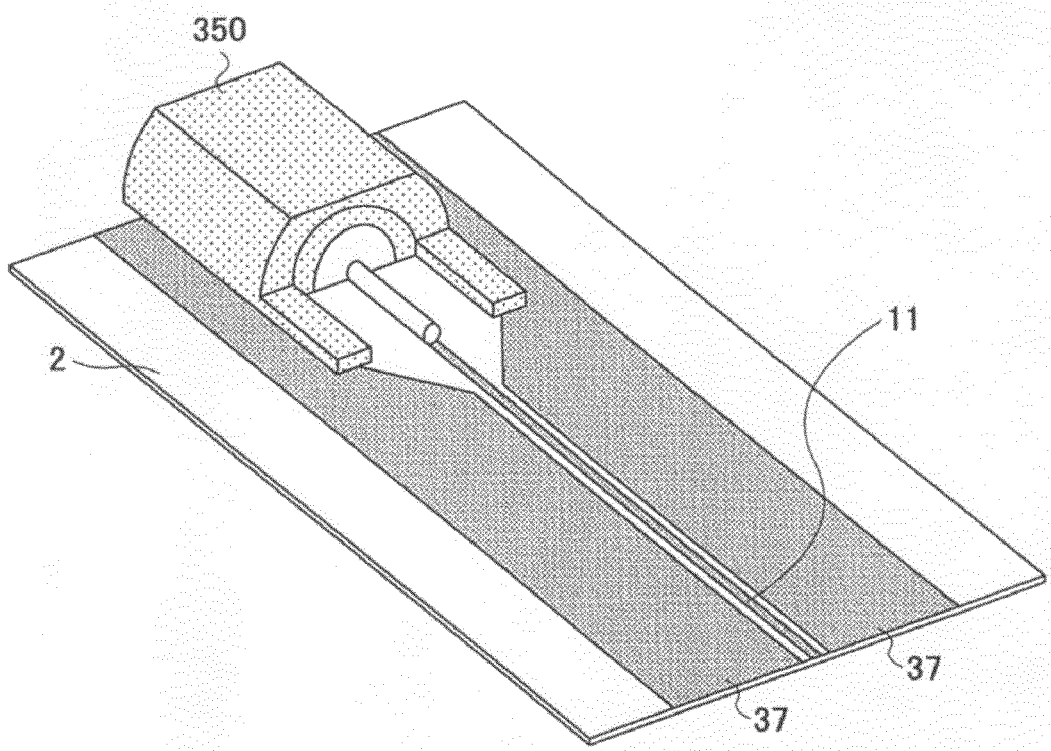
FIG. 21 is a perspective view showing an edge-mounted coaxial connector provided in the vicinity of the edge part of a connection part of the flexible board of the electronic component package shown in FIG. 5.

In addition, in the above-discussed examples, as shown in FIG. 21, an edge-mounted coaxial connector edge mount may be provided on the connection part of the film board. Here, FIG. 21 is a perspective view of the edge-mounted coaxial connector 350 provided in the vicinity of the edge part of a connection part of the flexible board of the electronic component package shown in FIG. 5

In the example shown in FIG. 21, the edge-mounted coaxial connector 350 is provided in the vicinity of the connection part 2-1 of the flexible board 2 of the electronic component package 10 shown in FIG. 5 and fixed on the connection part 2-1 by solder or silver (Ag) epoxy. The edge-mounted coaxial connector 350 is connected to the high frequency signal wiring conductor 11 sandwiched by ground conductors 37 made of copper (Cu) foil at the connection part 2-1. The edge-mounted coaxial connector 350 converts the high frequency signal wiring conductor 11 to a coaxial cable. Although a coaxial cable is pulled out in an arrangement direction of the high frequency signal wiring conductor 11 in the coaxial connector edge mount 350 in this example, the present invention is not limited to this. For example, an edge-mounted coaxial connecter where the coaxial cable is pulled out in a direction perpendicular to the above-mentioned direction may be used. By the coaxial connector edge mount 350, it is possible to easily connect to a package of a connecter interface such as an optical component or a MUX. The above-mentioned structure can be applied to not only the example shown in FIG. 5 but also the examples shown in FIG. 11, FIG. 19 and FIG. 20.

As discussed above, the liquid crystal polymer compared to polyimide has low absorption and good sealability and therefore can be used as sealing resin for sealing the IC component without forming a cavity. Hence, the liquid crystal polymer is heated to approximately 270° C. that is a melting point so as to be in a liquid state, and the liquid state liquid crystal polymer flows around the circumference of the IC component such as a compound semiconductor IC having good high frequency properties and solidifies. As a result of this, the IC component can be securely sealed so that high frequency properties can be improved.

What is claimed is:
1. An electronic component package, comprising:
a film board, which includes a film board main body part and a flexible connection part extending from the film board main body part to an outside, and in which an electronic component is mounted; and
a lid part mounted on the film board so as to cover a surface of the film board;
wherein liquid crystal polymer is used as an insulator of the film board,
the electronic component is provided in a cavity formed by the film board and the lid part, and
the electronic component is connected to a signal wiring conductor formed at the film board.

2. The electronic component package as claimed in claim 1,
wherein a metal surface is formed on a rear surface of the film board.

3. The electronic component package as claimed in claim 1,
wherein the film board has a multi-layer film structure.

4. The electronic component package as claimed in claim 1,
wherein the lid part is made of metal or ceramic.

5. The electronic component package as claimed in claim 1,
wherein a metal surface is formed on a surface where the film board and the lid part come in contact with each other.

6. The electronic component package as claimed in claim 5,
wherein the metal surface is formed at a position where the film board and the lid part come in contact with each other and inside of the position on the film board.

7. The electronic component package as claimed in claim 1,
wherein the signal wiring conductor includes a first signal wiring conductor configured to connect to a connection subject of the electronic component package and formed on a rear surface of the flexible connection part of the film board.

8. The electronic component package as claimed in claim 7,
wherein the signal wiring conductor includes a second signal wiring conductor formed on a surface of the film board main body part in the cavity formed by the film board and the lid part; and
the second signal wiring conductor is connected to the electronic component.

9. The electronic component package as claimed in claim 8,
wherein the first signal wiring conductor formed on the rear surface of the flexible connection part of the film board extends to a rear surface of the film board main body part of the film board; and
an end part at a film board main body part side of the first signal wiring conductor and an end part of the second signal wiring conductor formed on a surface of the film board main body part in the cavity forming part are connected to each other by a via hole, the via hole connecting the surface of the film board main body part and the rear surface of the film board main body part.

10. The electronic component package as claimed in claim 9,
wherein a sealing member is provided in the vicinity of the via hole on the rear surface of the film board main body part.

11. The electronic component package as claimed in claim 1,
wherein a plane plate made of metal or ceramic is adhered on a rear surface of the film board.

12. The electronic component package as claimed in claim 11,
wherein a groove forming part pierces the plane plate in a height direction at a part of the plane plate, the part facing a portion of the rear surface of the film board main body part where a first signal wiring conductor is formed.

13. The electronic component package as claimed in claim 1,
wherein the lid part is made of metal or ceramic, the signal wiring conductor is formed on a rear surface of the film board, and the lid part and the film board are connected to each other by a resin sealing member.

14. The electronic component package as claimed in claim 1,
wherein the film board has a grounded coplanar waveguide type transmission line structure.

15. The electronic component package as claimed in claim 1,
wherein an edge-mounted coaxial connector is fixed in the vicinity of an edge part of the flexible connection part.

16. The electronic component package as claimed in claim 1,
wherein the electronic component is flip-chip connected to the signal wiring conductor.

17. The electronic component package as claimed in claim 1,
wherein a hole for mounting the electronic component is formed in the film board, and
the electronic component is provided in the hole for mounting the electronic component and connected to the signal wire conductor by a wire.

18. The electronic component package as claimed in claim 17,
wherein when the hole for mounting the electronic component is formed in the film board,
a concave part for mounting the electronic component is formed in the plane plate so as to communicate with the hole for mounting the electronic component, and
the electronic component is provided in the hole and on the concave part so as to be connected to the signal wire conductor by the wire.

19. An electronic component package, comprising:
a film board which includes a first board and a second board that is flexible and extends from the first board to an outside, and an electronic component mounted on the film board; and
a lid mounted on the film board so as to cover a surface of the film board,
wherein liquid crustal polymer is used as an insulator of the film board,
the electronic component is provided in a cavity formed by the film board and the lid, and
the electronic component is electrically coupled to a signal line formed at the film board.

* * * * *